US009471720B1

(12) United States Patent
Aalami

(10) Patent No.: US 9,471,720 B1
(45) Date of Patent: Oct. 18, 2016

(54) COMBINED VERTICAL AND HORIZONTAL LOAD MODELING FOR CONCRETE STRUCTURES

(71) Applicant: ADAPT Corporation, Redwood City, CA (US)

(72) Inventor: Florian Aalami, New York, NY (US)

(73) Assignee: ADAPT Corporation, Redwood City, CA (US)

( * ) Notice: Subject to any disclaimer, the term of this patent is extended or adjusted under 35 U.S.C. 154(b) by 0 days.

(21) Appl. No.: 14/507,677

(22) Filed: Oct. 6, 2014

(51) Int. Cl.
  *G06F 17/50* (2006.01)
  *G06T 17/10* (2006.01)
  *E04B 1/14* (2006.01)

(52) U.S. Cl.
  CPC ........... *G06F 17/5004* (2013.01); *G06T 17/10* (2013.01); *E04B 1/14* (2013.01); *G06T 2210/04* (2013.01)

(58) Field of Classification Search
  USPC .............................................. 703/1
  See application file for complete search history.

(56) References Cited

U.S. PATENT DOCUMENTS

| 4,964,060 | A | * | 10/1990 | Hartsog ........................... 703/1 |
| 5,442,569 | A | | 8/1995 | Osano |
| 7,004,737 | B2 | | 2/2006 | Russell |
| 7,206,726 | B2 | | 4/2007 | Seeber et al. |
| 7,302,368 | B2 | * | 11/2007 | Rihtniemi et al. ................ 703/1 |
| 8,482,558 | B2 | | 7/2013 | Morello et al. |
| 2007/0179759 | A1 | * | 8/2007 | Mangon .......................... 703/1 |
| 2009/0125282 | A1 | * | 5/2009 | Takahashi et al. ............... 703/1 |

(Continued)

OTHER PUBLICATIONS

ADAPT Corporation, "ADAPT-Floor Pro 2010 User Manual", 2010.*

(Continued)

*Primary Examiner* — Aniss Chad
(74) *Attorney, Agent, or Firm* — Hickman Palermo Becker Bingham LLP

(57) ABSTRACT

In an embodiment, a method of determining loads of columns in building structures based upon both horizontal load factors and vertical load factors in a three-dimensional (3D) model of the building structures on a computer display device comprises: using a computer, obtaining plane definition data that defines a plurality of planes of a building structure, and locations of a plurality of columns that are on, into or above the planes, without load path input data that specifies an explicit load path among the columns, and displaying a 3D geometric representation of the planes and the columns; using the computer and the plane definition data, creating and storing plane tributary region data defining a plurality of tributary regions across the plane that are associated with the columns; determining, using the computer and the plane tributary region data, tributary data defining a tributary for each of the columns based only upon a geometry of the slabs or floors and the locations of the plurality of columns; determining, using the computer and the tributary data, independent of the plane definition data, one or more load transfer elements that indicate structural elements of the building structure that transfer load from a first particular column of a first one of the planes to a second particular column of a second one of the planes; using the computer, determining and graphically displaying a plurality of proposed load paths in the building structure through the columns and the one or more load transfer elements; determining a plurality of load values associated with the columns of the building structure; creating and causing displaying a list of the sub-areas, tributaries, and load values.

26 Claims, 12 Drawing Sheets

(56) References Cited

U.S. PATENT DOCUMENTS

2012/0215465 A1     8/2012   Shuraim et al.
2013/0211795 A1*   8/2013   Vanker et al. .................... 703/1

OTHER PUBLICATIONS

ASPIRE, "Chicago Spire", ASPIRE Master of Engineering Structural Design Project, Cornell University, May 2010.*
Beghini, Lauren, "Building Science Through Topology Optimization", Dissertation, University of Illinois, 2013.*
ADAPT Corporation, "ADAPT-Builder 2012 Getting Started Guide", Feb. 2013.*
Nawari O. Nawari, "Collaborative BIM in Teaching Architectural Structures", Proceedings of the CIB W78: 29th International Conference, Oct. 17-19, 2012.*

* cited by examiner

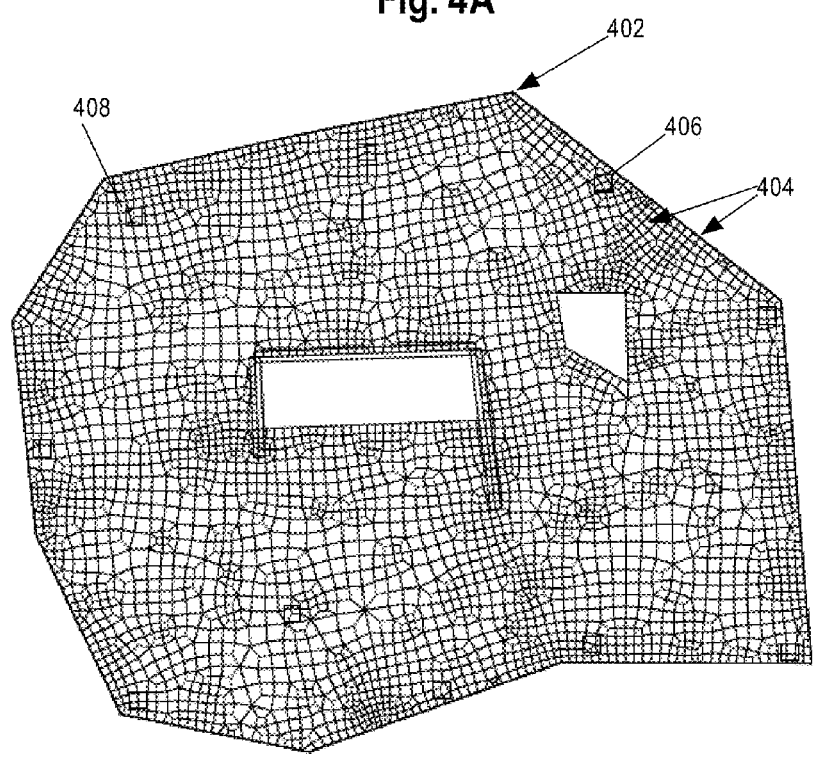

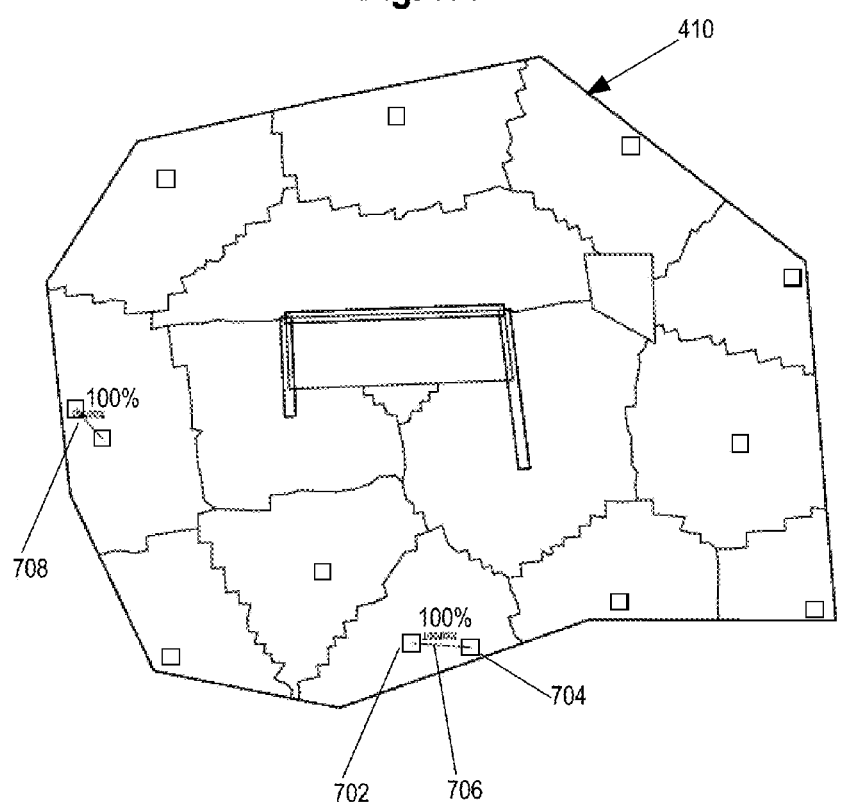

COMBINED VERTICAL AND HORIZONTAL LOAD MODELING FOR CONCRETE STRUCTURES

FIELD OF THE DISCLOSURE

The present disclosure generally relates to computer-implemented techniques for determining loads in concrete structures. The disclosure relates more specifically to computer-implemented techniques for determining loads in concrete structures in which modeling of vertical building elements and horizontal building elements is combined.

BACKGROUND

The approaches described in this section are approaches that could be pursued, but not necessarily approaches that have been previously conceived or pursued. Therefore, unless otherwise indicated, it should not be assumed that any of the approaches described in this section qualify as prior art merely by virtue of their inclusion in this section.

The design of a modern reinforced concrete structure, such as a building, requires determining theoretical loads or weights in different parts of the building before the building is actually constructed. Typically three-dimensional (3D) finite element modeling (FEM) analysis is used in computer systems to determine the vertical load imposed by a slab while taking into account the elastic distribution of force within a slab. This approach is useful for individual slabs but is not normally practical to use in the design of vertical elements such as columns, especially when the columns in a multi-story structure are not vertically aligned directly above one another.

To address this deficiency in 3D FEM approaches, civil engineers have often resorted to hand calculation of vertical loads and distribution of loads in spreadsheets. This approach often is motivated by mistrust of the load computations that 3D FEM systems provide. As a result, the engineers are required to relate the results of two completely different systems—the 3D FEM model in one program, and a spreadsheet—in ways that are awkward and error-prone.

Alternatively, frame-based software may be used to determine load tributary distribution in steel structures and in some concrete structures, provided that the load paths are explicitly identified, for example using beams for horizontal load transfer that connect to specific columns for continued vertical load transfer. The requirement for explicit definition of load paths in this approach is a significant disadvantage. In addition, these approaches require that slabs and floors are strictly defined as a set of explicitly connected beams, columns, slab regions, and walls. Most modern concrete buildings are not constructed with beams as their primary load-bearing elements, as required by the traditional frame-based method of load transfer calculation, making automated calculation not possible. There is a clear need in the civil engineering field for a significantly improved approach to designing both slabs and columns in an integrated manner that is not restricted by the type and configuration of the structure.

SUMMARY

The appended claims may serve as a summary of the invention.

BRIEF DESCRIPTION OF THE DRAWINGS

In the drawings:

FIG. 4A is a schematic plan view of a single floor of the building structure of FIG. 3, with a plurality of discretized sub areas.

FIG. 7A is a schematic plan view as seen in FIG. 4B and illustrating a first example of placement of a plurality of load transfer elements for a plurality of columns.

DETAILED DESCRIPTION

Figure 1:
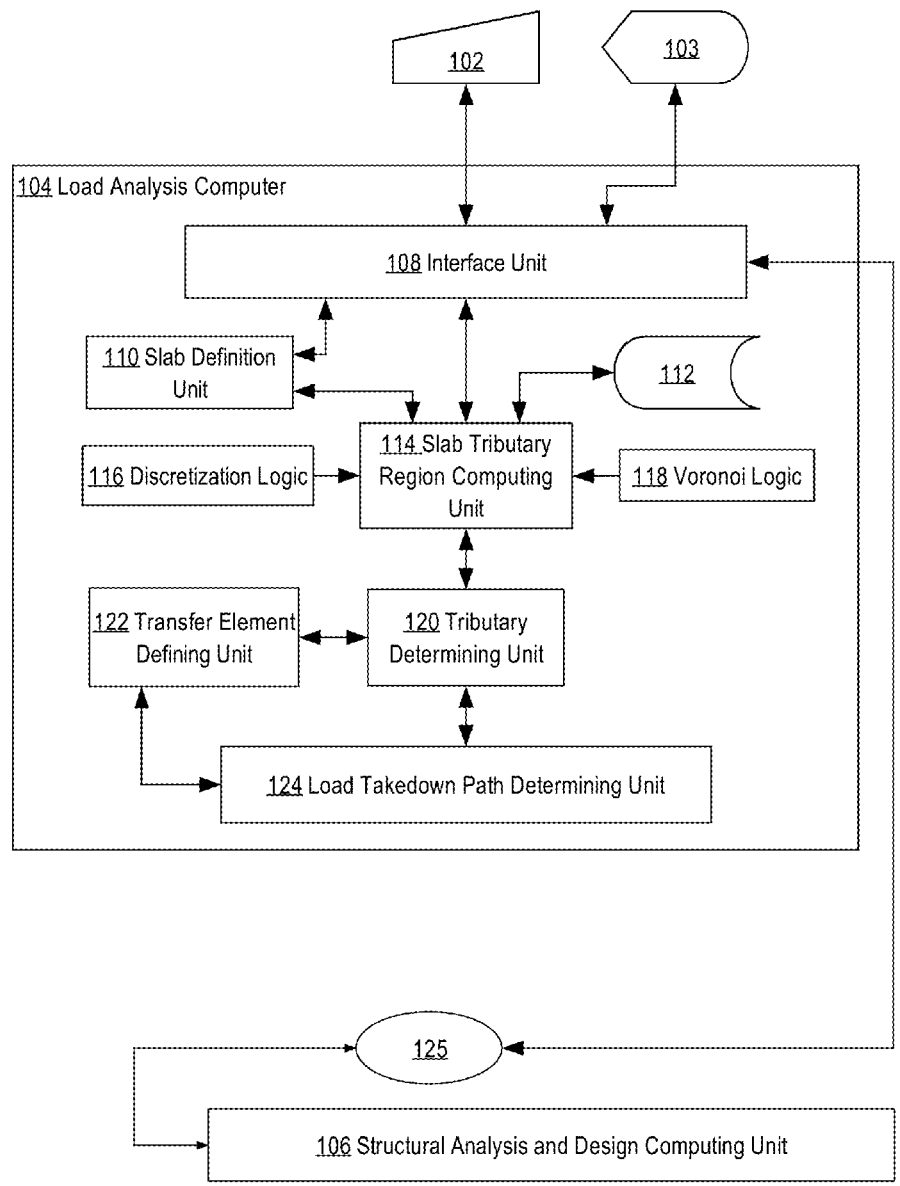
FIG. 1 illustrates an improved computer system according to an embodiment.

In the following description, for the purposes of explanation, numerous specific details are set forth in order to provide a thorough understanding of the present invention. It will be apparent, however, that the present invention may be practiced without these specific details. In other instances, well-known structures and devices are shown in block diagram form in order to avoid unnecessarily obscuring the present invention.

1. General Overview

In an embodiment, a computer-implemented data method provides an improved process of determining loads of columns in building structures based upon both horizontal load factors and vertical load factors in a three-dimensional (3D) model of the building structures on a computer display device, the method comprising: using a computer, obtaining plane definition data that defines a plurality of planes of a building structure, and locations of a plurality of columns that are on, into or above the planes, without load path input data that specifies an explicit load path among the columns, and displaying a 3D geometric representation of the planes and the columns; using the computer and the plane definition data, creating and storing plane tributary region data defining a plurality of tributary regions across the plane that are associated with the columns; determining, using the computer and the plane tributary region data, tributary data defining a tributary for each of the columns based only upon a geometry of the slabs or floors and the locations of the plurality of columns; determining, using the computer and the tributary data, independent of the plane definition data, one or more load transfer elements that indicate structural elements of the building structure that transfer load from a first particular column of a first one of the planes to a second particular column of a second one of the planes; using the computer, determining and graphically displaying a plurality of proposed load paths in the building structure through the columns and the one or more load transfer elements; determining a plurality of load values associated with the columns of the building structure; creating and causing displaying a list of the sub-areas, tributaries, and load values.

In one feature, creating and storing slab tributary region data comprises, using the computer, discretizing the slab definition data to result in creating and storing discretized slab data defining a plurality of discrete regions across each of the slabs or floors that are associated with the columns. In another feature, creating and storing slab tributary region data comprises, using the computer, performing Voronoi decomposition upon the slab definition data.

In another feature, determining the tributary data comprises: using the computer, associating a plurality of regions of the plane or floor represented in the discretized plane data with a particular sub-area from among a plurality of sub-areas; storing, in association with each particular sub-area, a column identifier of a particular column among the plurality of columns that is closest to that particular sub-area.

In various features, the method may include receiving input data specifying a modification to one of the sub-areas and receiving input data specifying a modification of the proposed load path. In various embodiments, the plane definition data defines the plane or floor using any polygonal form of perimeter and the plane definition data includes beam definition data defining one or more beams in the plane.

In one embodiment, the method may be performed as a part of a computer-implemented general three-dimensional (3D) finite element method (FEM) building design program.

In yet another feature, the method comprises, using the computer, receiving granularity input specifying a larger or smaller granularity level for the discrete regions, and reperforming the step of discretizing the plane definition data to result in creating and storing updated discretized plane data defining an updated plurality of discrete regions that are associated with the columns, based upon the specified granularity level. Another embodiment may include obtaining locations of walls that are on the planes, creating and storing the plane tributary region data defining the tributary regions additionally in association with the columns and walls, determining the one or more load transfer elements in relation to the columns and walls, and determining the proposed load paths through the columns and walls.

In an embodiment, the method further comprises automatically determining, based upon the load transfer elements, proposed percentages of contribution of load for each of the columns; obtaining one or more input percentage values specifying one or more modifications to the proposed percentages of contribution; determining the proposed load paths based also upon the percentages of contribution. In one feature, the method includes determining and graphically displaying cumulative load values and sub-areas and tributaries for one or more load take-down units, and/or communicating one or more of the tributary region data, tributary data, and load values to one or more computing devices that are hosting or executing one or more structure design programs or structure analysis programs.

Other embodiments may comprises one or more non-transitory storage media storing instructions which, when executed by one or more computing devices, cause performing the method as previously described; a special-purpose computer system that is configured as described herein to perform the method as previously described; and other forms of computing devices and computer program products that are configured to implement the functions that are described herein.

2. Example Improved Computer System and Processing Method

Figure 2:
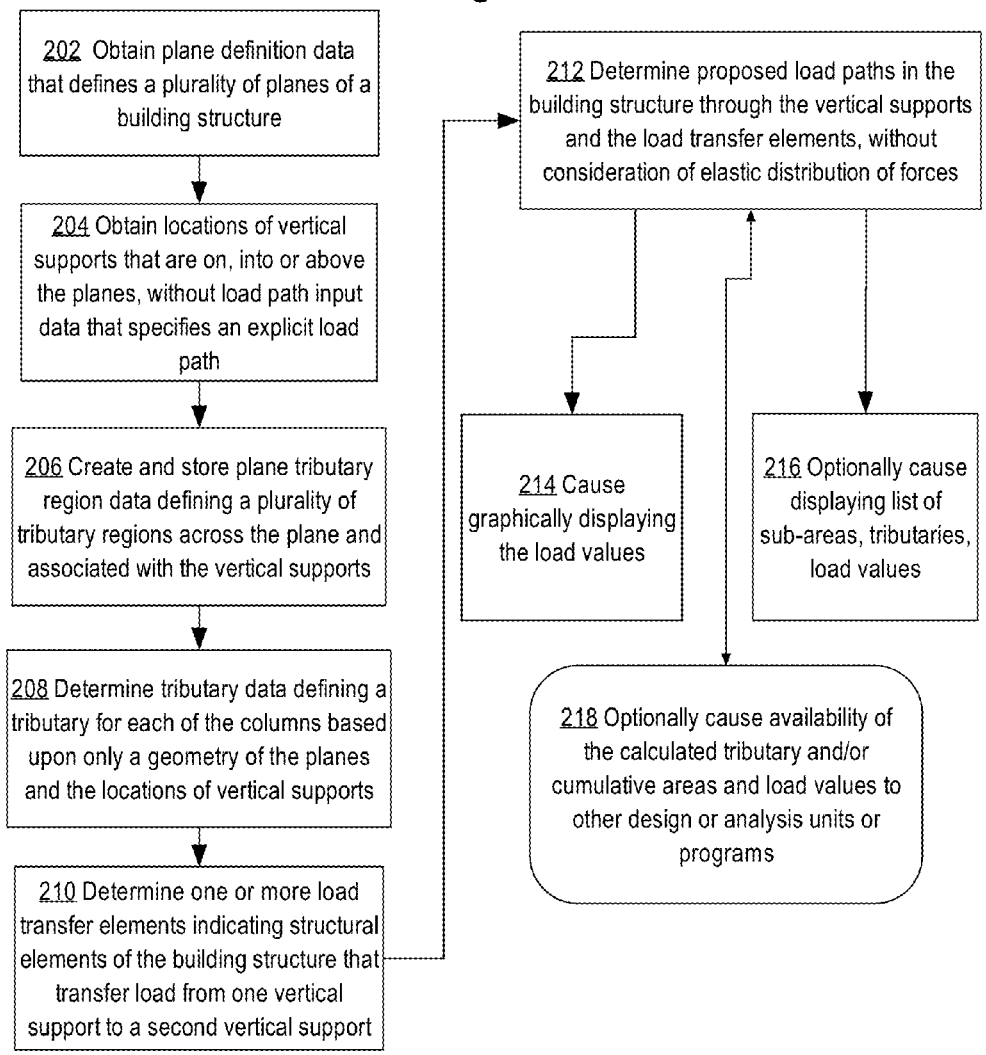
FIG. 2 is a diagram of an algorithm and computer program instructions that may be used to implement a computer-executed process according to an embodiment.

FIG. 1 illustrates an improved computer system according to an embodiment. FIG. 2 is a diagram of an algorithm and computer program instructions that may be used to implement a computer-executed process according to an embodiment. Referring first to FIG. 1, in one embodiment, a load analysis computer 104 is coupled to an input terminal 102 having a computer display device 103. In various embodiments, load analysis computer 104 may comprise a first computer and the input terminal 102 may comprise a second computer that is coupled to the first computer using a network, which is omitted in FIG. 1 for simplicity and clarity. Alternatively, the load analysis computer 104, input terminal 102 and display device 103 may comprise a single computer system.

In an embodiment, load analysis computer 104 comprises an interface unit 108 coupled to a slab definition unit 110 and slab tributary region computing unit 114. Discretization logic 116 and Voronoi decomposition logic 118 may be coupled to the slab tributary region computing unit 114, which may be coupled further to a tributary determining unit 120. A transfer element defining unit 122 also may be coupled to the tributary determining unit 120 and to a load takedown path determining unit 124. In various embodiments, each of the units within load analysis computer 104 may be implemented in the form of one or more computer programs, other software elements, firmware, ASICs, FPGAs, or a combination thereof. For example, load analysis computer 104 may be implemented as an improved, special-purpose computer, or as a general-purpose computer that executes stored programs and becomes, by loading and executing the stored programs, an improved computer that is configured to determine load values, as described herein, with the improvements specified herein.

In an embodiment, the interface unit 108 is configured to receive data signals and input values from the input terminal 102 and to provide graphical displays, including 3D visualizations of building structures and tables of data such as load values, load contribution percentages and tributary data, to the display device 103. The interface unit 108 may incorporate input/output buffers, presentation layer logic configured to render displays using vector graphics, rasterized graphics or HTML.

In some embodiments, interface unit 108 is further coupled to another computer that hosts or executes a structural analysis program for the purpose of structural design of building structures. An example is structural analysis and design computing unit 106 as seen in FIG. 1 coupled to network 125. Such structural analysis and design programs can use more advanced 3D Finite Element Method (FEM) approach or simple design formulas in spreadsheet format. For example, the interface unit 108 may be configured to communicate results of tributary load calculation, after determining cumulative loads in each vertical support, for use in the design of vertical supports such as columns and walls, using separate the structural analysis program at another computer or the same computer. Or, the interface unit 108 may be configured to communicate such data to the structural analysis program to carry out more detailed analysis of any floor in a building model. These approaches may integrate with the support loads that have been calculated, in the structural analysis and design program, connected to a particular floor.

In an embodiment, slab definition unit 110 is configured to receive data defining planar surfaces of building structures. "Slab," in this context, is used for convenience to refer to any planar surface of a building structure, typically a steel reinforced concrete slab or floor. Typically a building structure that is designed and visualized using an embodiment is a multi-story building so that the slab definition unit 110 is configured to receive data to define a plurality of floors with the same or different floor plates or perimeter geometries. Visualization functions may be integrated. For example, the slab definition unit 110 may be integrated into a 3D building structure modeling program that is configured to receive input from a pointing device, such as a mouse or trackball, to define the perimeter geometry and thickness of the planar surfaces and to generate and cause displaying a 3D graphical image of the planar surfaces. In these embodiments, the 3D graphical images may be rotated and/or translated to permit visualization from different perspectives or for different parts.

The slab definition unit 110 is further configured to receive input data specifying locations and size of vertical supports of a building, such as columns or walls. "Vertical support," in this description, may refer to a column or wall and the plural term "vertical supports" may encompass any combination of columns or walls of a particular building. Slab definition unit 110 and other units of load analysis computer 104 may be coupled to a local or shared database 112 that is configured to receive and store data representing models of building structures and the tributaries and load data that is further described herein.

In an embodiment, the slab tributary region computing unit 114 is configured to determine a plurality of tributary regions of one or more of the slabs. Various computing techniques, algorithms and program instructions may be used, in various embodiments, to determine the tributary regions. In two example approaches, discretization logic 116 and Voronoi decomposition logic 118 may be coupled to the slab tributary region computing unit 114 and configured respectively to determine the tributary regions using a discretization algorithm and an implementation of Voronoi area decomposition techniques.

In an embodiment, the tributary determining unit 120 is configured to receive definitions of tributary regions from the slab tributary region computing unit and to determine tributary loads and areas from that data. The transfer element defining unit 122 may be configured to receive input data specifying load transfer elements, such as beams, of the building structure that join one or more pairs of the vertical supports and thereby transfer a percentage of load from one vertical support to one or more other vertical supports. The load takedown path determining unit 124 may be configured to determine a plurality of load takedown paths and specific load takedown values, for each of the vertical supports and each of the slabs, in the building structure.

Figure 3:
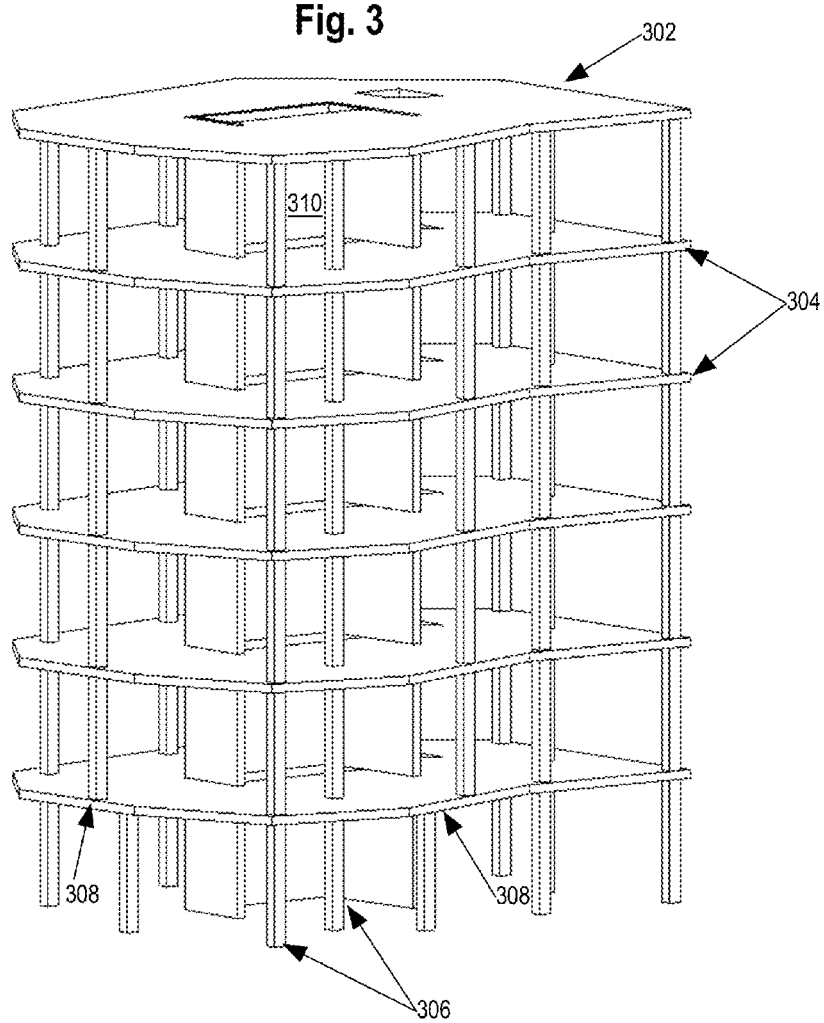
FIG. 3 is a three-dimensional (3D) schematic perspective view of a hypothetical example multi-story building structure with which an embodiment may be used, and as seen in a computer screen display of a structural design program.
Figure 4B:
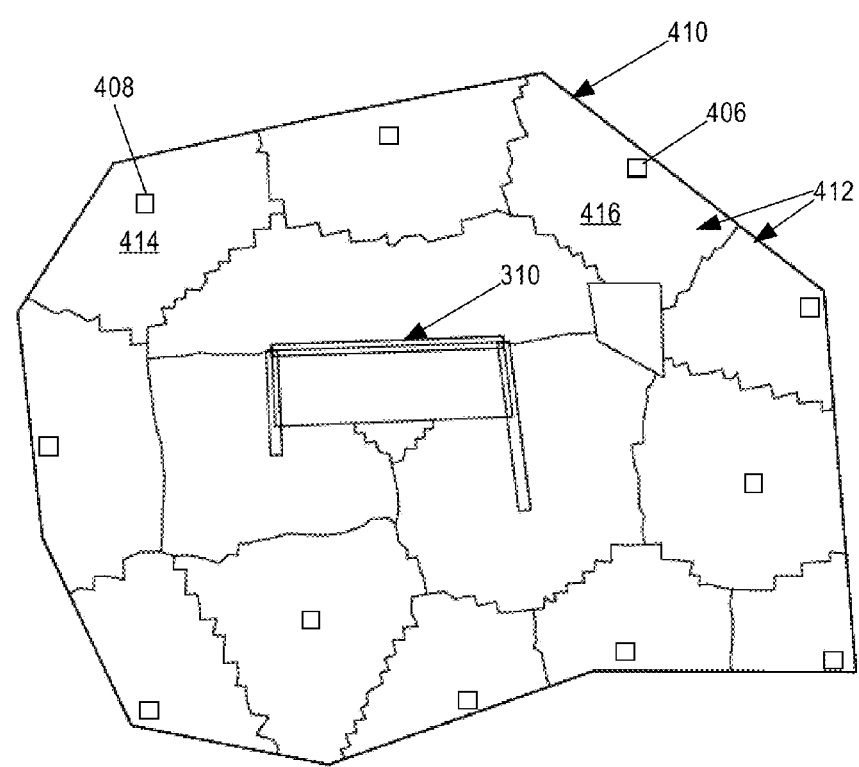
FIG. 4B is a schematic plan view as seen in FIG. 4A and comprising a plurality of tributary regions organized around intersection points of columns using a discretization approach.
Figure 5:
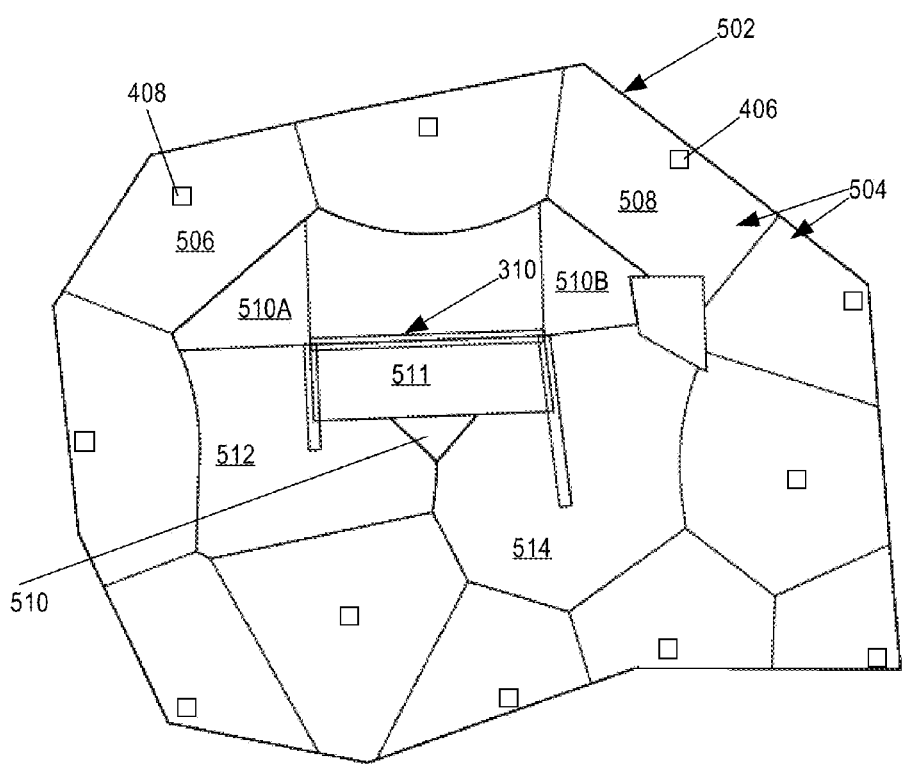
FIG. 5 is a schematic plan view as seen in FIG. 4A and comprising a plurality of tributary regions organized around columns, using a Voronoi decomposition approach.
Figure 6:
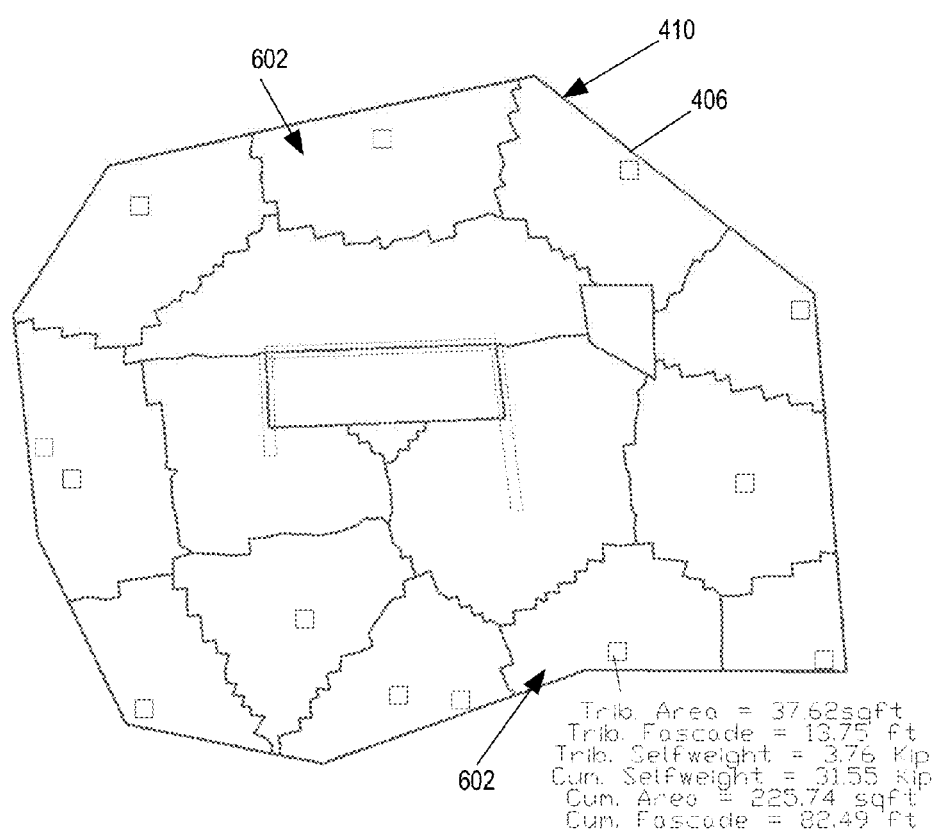
FIG. 6 is a schematic plan view as seen in FIG. 4B and comprising data labels specifying load values that have been automatically determined for each of the columns.
Figure 7B:
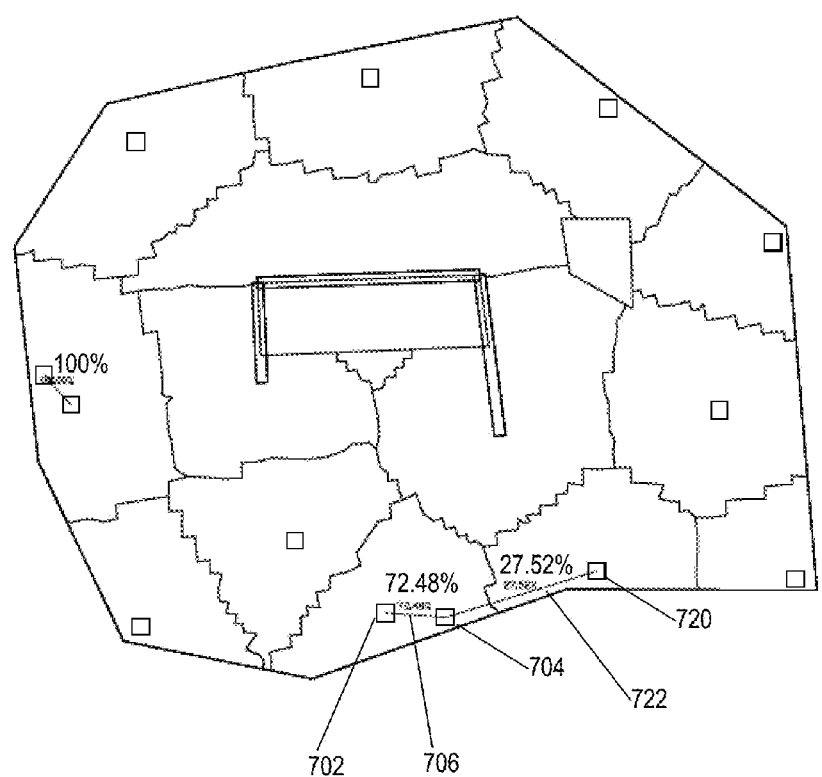
FIG. 7B is a schematic plan view as seen in FIG. 4B and illustrating a second example of placement of a plurality of load transfer elements for a plurality of columns.
Figure 7C:
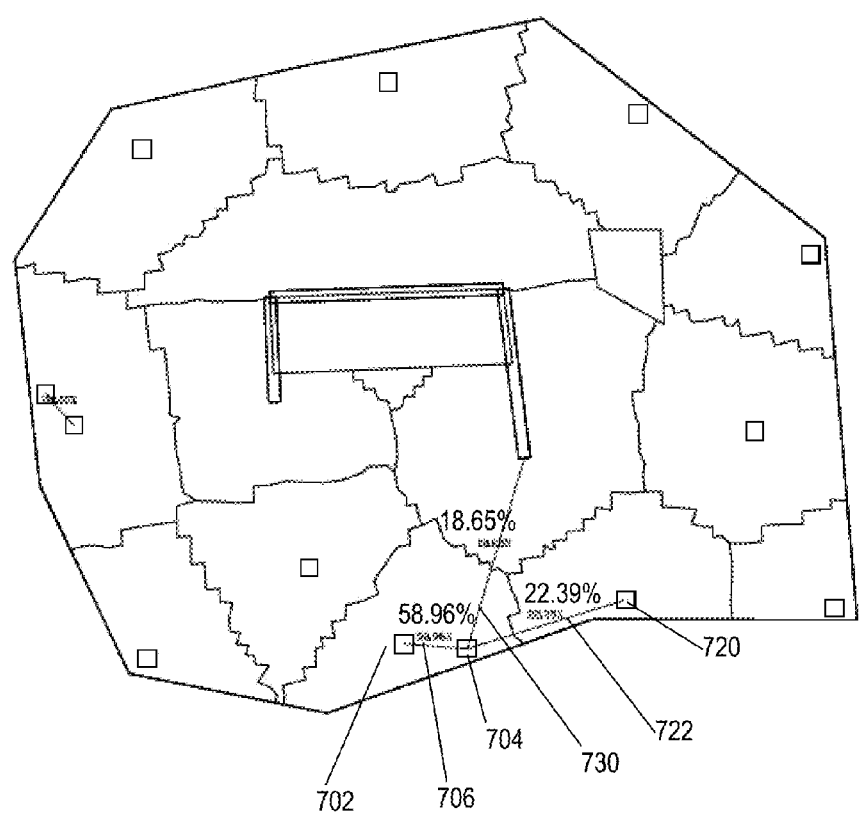
FIG. 7C is a schematic plan view as seen in FIG. 4B and illustrating a third example of placement of a plurality of load transfer elements for a plurality of columns.

For purposes of illustrating a clear example, the embodiments of FIG. 1, FIG. 2 are further described herein with reference to diagrams of a hypothetical multi-story building, such as an office tower, apartment block, or other structure. FIG. 3 is a three-dimensional (3D) schematic perspective view of a hypothetical example multi-story building structure with which an embodiment may be used, and as seen in a computer screen display of a structural design program. FIG. 4A is a schematic plan view of a single floor of the building structure of FIG. 3, with a plurality of discretized sub areas. FIG. 4B is a schematic plan view as seen in FIG. 4A and comprising a plurality of tributary regions organized around intersection points of columns using a discretization approach where each tributary region is computed as the boundary of all discrete slab elements that are closest to a specific support. FIG. 5 is a schematic plan view as seen in FIG. 4A and comprising a plurality of tributary regions organized around columns, using a Voronoi region decomposition approach where the tributary boundary is computed to define a region where every part of its area is closest to a specific support. FIG. 6 is a schematic plan view as seen in FIG. 4B and comprising data labels specifying load values that have been automatically determined to fall within the tributary boundary for each of the columns. FIG. 7A is a schematic plan view as seen in FIG. 4B and illustrating a first example of placement of a plurality of load transfer elements for a plurality of columns. The Transfer Element Defining Unit 122 automatically identifies discontinuous upper supports in a slab and defines load transfer elements to specific lower supports that are closest. FIG. 7B is a schematic plan view as seen in FIG. 4B and illustrating a second example of placement of a plurality of load transfer elements for a plurality of columns. FIG. 7C is a schematic plan view as seen in FIG. 4B and illustrating a third example of placement of a plurality of load transfer elements for a plurality of columns. However, embodiments are not limited to the example of FIG. 3 to FIG. 7C inclusive, and embodiments may be used to model and engineer the construction of multi-story buildings having any configuration of one or more different floor plates and any number of floors. The Interface Unit 108 provides the interaction capability for an engineer to adjust the definition of transfer elements.

Figure 8:
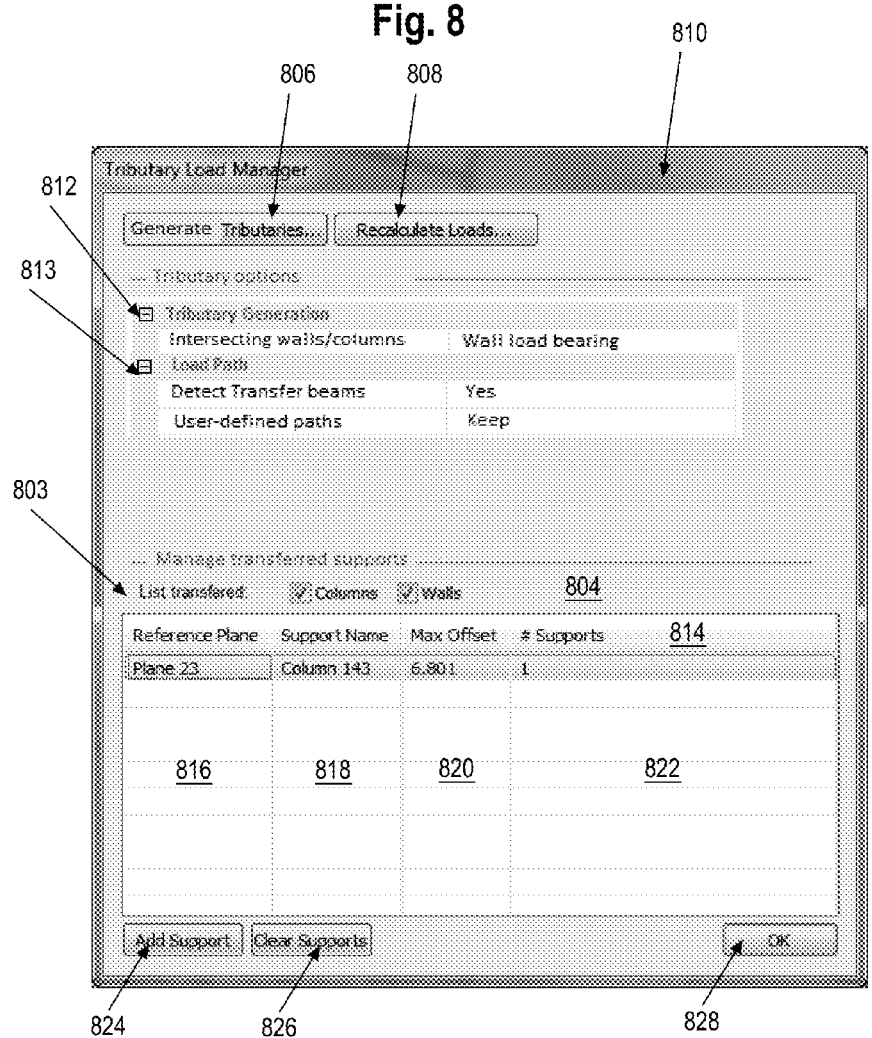
FIG. 8 illustrates an example display on a computer display device of a portion of a user interface relating to configuring tributary loads.

Graphical user interface embodiments that may be used are also described herein with reference to examples. FIG. 8 illustrates an example display on a computer display device of a portion of a user interface relating to configuring tributary boundaries, defining transfer elements, calculating tributary loads, and is described in a separate section herein.

Referring now to FIG. 2, in one embodiment, an improved load computing process or algorithm, which may be implemented using the computer program instructions of FIG. 2, begins at block 202 at which the process obtains plane definition data that defines a plurality of planes of a building structure. At block 204, the process obtains locations of vertical supports that are on, into or above the planes, but without load path input data that specifies an explicit load path through the vertical supports. The data referenced in block 202, block 204 may be obtained using 3D graphical drawing and modeling functions of a structural design program. As an example, FIG. 3 shows a hypothetical building structure 302 comprising a plurality of spaced-apart slabs 304, which ultimately may form floors of the building, and a plurality of vertical supports including columns 306, 308 and walls 310. Depending on the goals of an architect or engineer of the building in relation to structure or aesthetics, some of the vertical supports of a particular floor may not bear directly down upon other vertical supports of other floors. For example, in FIG. 3, columns 308 do no bear upon other vertical supports and therefore the proper computation of load takedown values typically will involve determining one or more transfer elements or load transfer paths by which downward compressive loads are transferred among the vertical supports. In an embodiment, these determinations are performed automatically in subsequent blocks, as further described herein.

However, the ultimate feature of block 204—without load path input data that specifies an explicit load path—represents a distinct improvement over the state of the art and a meaningful limitation with respect to the general idea of determining load values with a 3D model of a building structure. In embodiments here, proposed load paths and load takedown values may be determined using geometric techniques and geometric analysis of the 3D model without requiring a civil engineer or other user to specify particular load path input data at the time of block 202, block 204.

At block 206, the process creates and stores plane tributary region data defining a plurality of tributary regions across the plane and associated with the vertical supports. In an embodiment, discretization logic is used to determine the regions and bounds of a particular tributary region depend only upon the geometric proximity of the tributary region to a position of a vertical support, or a perimeter, of a particular plane representing a building floor plate. In other words, the elastic distribution of force through the plane or building floor is not considered in this approach and its omission has been found, in experimentation, to yield results that are as accurate as prior techniques that require laborious calculation of elastic forces across a slab. Using such a discretization approach, for the hypothetical building of FIG. 3, the result of discretization for one floor may have the appearance of FIG. 4A, in which a particular floor 402 is illustrated having column positions 406, 408 and a large number of discrete tributary regions 404.

At block 208, the process determines tributary data defining a slab tributary region for each of the vertical supports based upon only the discretized slab data (e.g., the data created for FIG. 4A), geometry of the planes and the locations of the vertical supports. In various embodiments, discretization logic or Voronoi decomposition logic may be used to determine the regions using a discretization approach or Voronoi decomposition approach. In each case, the bounds of a particular tributary region depend only upon the geometric proximity of the tributary region to a position of a vertical support, or a perimeter, of a particular plane representing a building floor plate. In other words, the elastic distribution of force through the plane or building floor is not considered in this approach and its omission has been found, in experimentation, to yield results that are as accurate as prior techniques that require laborious calculation of elastic forces across a slab.

Using such a discretization approach, for the hypothetical building of FIG. 3, the result of discretization for one floor may have the appearance of FIG. 4B, in which a particular floor 410 has column positions 406, 408, walls 310 and a plurality of tributaries 412. Each of the tributaries 412 encloses and is associated with one of the columns 406, 408 that represents a principal load-bearing vertical support for that portion of the slab that is represented in the tributary.

In mathematics, a Voronoi diagram is a way of dividing space into a number of regions. A set of points (called seeds, sites, or generators) is specified beforehand and for each seed there will be a corresponding region consisting of all points closer to that seed than to any other. The regions are called Voronoi cells. In the simplest case, the process receives a finite set of points $\{p_1, \ldots, p_n\}$ in the Euclidean plane. In this case each site $p_k$ is a point and its corresponding Voronoi cell (also called Voronoi region or Dirichlet cell) $R_k$ consisting of every point whose distance to $p_k$ is less than or equal to its distance to any other site. Each such cell is obtained from the intersection of half-spaces, and hence it is a convex polygon. The segments of the Voronoi diagram are all the points in the plane that are equidistant to the two nearest sites. The Voronoi vertices (nodes) are the points equidistant to three (or more) sites.

Voronoi decomposition may be formally defined as follows. Let X be a space (a nonempty set) endowed with a distance function d. Let K be a set of indices and let $(P_k)_{k \in K}$ be a tuple or ordered collection of nonempty subsets (the sites) in the space X. The Voronoi cell, or Voronoi region, $R_k$, associated with the site $P_k$ is the set of all points in X whose distance to $P_k$ is not greater than their distance to the other sites $P_j$, where j is any index different from k. In other words, if $d(x, A)=A=\inf\{x, a)|a \in A\}$ denotes the distance between the point x and the subset A, then:

$$R_k = \{x \in X | d(x, P_k) \leq d(x, P_j) \text{ for all } j \neq k\}$$

The Voronoi diagram is the tuple of cells $(R_k)_{k \in K}$. In principle some of the sites can intersect and even coincide, but usually they are assumed to be disjoint. In the particular case where the space is a finite-dimensional Euclidean space, each site is a point, there are finitely many points and all of them are different, then the Voronoi cells are convex polytopes and they can be represented in a combinatorial way using their vertices, sides, 2-dimensional faces, etc. Sometimes the induced combinatorial structure is referred to as the Voronoi diagram. However, in general the Voronoi cells may not be convex or even connected.

Using the Voronoi decomposition approach, for the hypothetical building of FIG. 3, the result of discretization for one floor may have the appearance of FIG. 5, in which a particular floor 502 has column positions 406, 408, walls 310 and a plurality of tributaries 504 according to Voronoi regions or geometry. Each of the tributaries 504 similarly encloses and is associated with one of the columns 406, 408 that represents a principal load-bearing vertical support for that portion of the slab that is represented in the tributary.

In experimentation it has been found that use of the Voronoi decomposition approach may result in generating one or more error regions. In this context, an error region is one that is accurately generated using the Voronoi approach, and represents a region that is closest to a particular vertical support, but is positioned so that the region cannot transfer its load to the vertical support because it is physically separated from the vertical support by an opening or other anomaly. Referring to FIG. 5, an error region 510 is shown that is technically closest to wall 310 but is separated from that wall by an opening 511. A classic implementation of the Voronoi decomposition approach for typical building structures can also generate other error regions 510A, 510B. These error regions represent slab areas that cannot be computed using the Voronoi decomposition method because more than one unique seed are modeled at one location, for example, where two wall ends intersect. In an embodiment, the process herein is configured to identify one or more non-conforming error regions that are physically disconnected from the closest vertical support or generated because of non-unique seed definition. Each identified error region, such as region 510 for example, is further discretized to create two or more sub-regions. For example, region 510 may be divided into two sub-regions. Each discretized sub-region is merged with an adjacent tributary region or regions, such as regions 512, 514, for example, to produce final tributary region definitions that are acceptable to structural engineers.

A user of the process with a computer may elect, at this point in the process or another point, to request and cause generating a screen display showing a particular slab and the particular load values that have been computed for vertical supports based upon the geometry represented in the tributaries. FIG. 6 illustrates an example of the output of FIG. 4B further comprising graphical text that specifies load data relating to each of the vertical supports in the view.

At block 210, the process determines one or more load transfer elements indicating structure elements of the building structure that transfer load from one vertical support to one or more other vertical supports. In one embodiment, obtaining data defining load transfer elements may be performed graphically in the context of the 3D structure design program that supports other aspects of the process. FIG. 7A illustrates a first example in which user input has specified, for a particular floor 410, a first load transfer element 706 between a first pair of vertical supports 702, 704 and a second load transfer element 708 for another pair of vertical supports. Specifying a load transfer may be performed based upon geometry using graphical drawing techniques such as selecting a first vertical support 702 and dragging a pointing device to a second vertical support 704. Further, in an embodiment, specifying a transfer element comprises obtaining data input indicating a percentage of load that is transferred to the lower support to which the transfer element points. In the example of FIG. 7A, load transfer element 706 includes a text label indicating a percentage of load that is transferred from discontinuous support 704 to support 702. In various embodiments, the percentage values may be obtained as user input in a graphical user interface, for example, by right-clicking on the transfer element line or by accessing a menu panel that permits entering the value.

FIG. 7B illustrates a second example showing the transfer elements of FIG. 7A and further showing a third transfer element 722 between vertical supports 704, 720; the later result of adding the third transfer element is to change load distribution for all of the vertical supports 702, 704, 720 that are in the overall transfer path represented by transfer elements 706, 722. In this example, the load from a discontinuous upper support, as seen in FIG. 3, is transferred to two lower supports, and the percentage of load transfer is calculated automatically based upon the inverse of the distance from the discontinuous support to the respective other supports.

FIG. 7C illustrates a third example in which a fourth transfer element 730 has been defined to join vertical support 704 and walls 310; thus in this example the load of the discontinuous support is specified to transfer to three (3) lower supports including a combination of columns and walls. In a manner similar to FIG. 7B, the fourth transfer element will impact load distribution for vertical supports 702, 704, 720, and the walls 310 in later computations. However, the effect of load distribution may be computed automatically based solely upon the geometry shown in FIG. 7C.

At block 212, the process automatically determines proposed load paths in the building structure through the vertical supports and the load transfer elements, and based upon the transfer contribution percentages allocated to or defined for each transfer element. In an embodiment, and in a distinct improvement over the state of the art, the determinations of block 212 are performed without consideration of elastic distribution of forces.

At block 214, the process is configured to cause graphically displaying the load values, for example, using a computer display device. At block 216, the process is configured to optionally cause displaying a list of sub-areas, tributaries and load values. The steps of block 214, block 216 may be performed, in various embodiments or at different times in one embodiment, for the values that have been calculated for a particular plane, or for the cumulative values that have been calculated as part of the load takedown unit 124.

At block 218, the process may be configured to cause the availability of the calculated tributary and/or cumulative areas and load values for other design and analysis units or programs. For example, a distinct improvement provided by the techniques herein is for the user to select which loads the user wishes to use for the design of vertical supports. The selection may indicate using the tributary values that have been calculated based upon geometry and transfer elements as described herein, or values that are calculated based upon FEM results using the elastic response of the structure, in another program or using other processes that are outside the scope of this disclosure.

FIG. 8 illustrates an example graphical user interface that may be generated using tributary load manager logic. The tributary load manager logic may be implemented in one or more of the tributary determining unit 120, slab tributary region computing unit 114, and interface unit 108 (FIG. 1). In this embodiment, the tributary load manager logic is configured to automatically identify all discontinuous supports, which may be columns or walls, in the building model and to provide a user with the ability to modify the load transfer rules for these supports. Load from discontinuous supports can be transferred to no other support, or any number of user-selected lower supports. The load path of the discontinuous support is terminated if no lower support is selected.

In one embodiment, a graphical user interface panel 810 comprises a plurality of GUI widgets that may be selected or manipulated to access various programmatic functions, including a Generate Tributaries button 806, Recalculate Loads button 808, Tributary Generation options 812, and Load Path options 813. The Generate Tributaries 806 button triggers the calculation of new tributary regions, tributary load/area calculation, and load takedown determination as outlined in FIG. 1. This function is used by the end-user each time the structural geometry has changed and the physical definition of tributary boundaries may have changed. The Recalculate Loads 808 button causes skipping the generation of new tributary regions (using computing unit 114) and invokes the Tributary Determining Unit to re-calculate tributary specific data such as loads that fall in a tributary region as well as the area of each tributary region. This function is used when the geometry of the slab has not changed, but the applied loads on the structure may have changed, requiring their re-calculation. In one embodiment, the end-user is presented with one or more tributary generation options. These can be presented as a list 812 with further configuration options. Tributary generation options are developed to resolve potential conflicts or prioritize options when encountered by the Slab Tributary Region Computing Unit 114. An illustrative example is where a column and wall intersect. In such a case, neither the slab discretization nor Voronoi approaches can computationally find an explicit solution for which slab region(s) is closest to a specified support. To resolve this conflict, a user would select whether walls or columns should have priority as the load bearing support in the model. The tributary generation options result in filtering or pre-processing of the data received from the Slab Definition Unit 110 before completing the computations in the Slab Tributary Region Computing Unit 114. In an embodiment, the panel 810 further comprises a list of load path detection options 813 with which a user can specify preferences for how the Transfer Element Defining Unit 122 detects and manages transfer elements between supports that are not continuous top to bottom between levels of a structure. As an illustration, one option tells the computational unit to auto detect beams, if present in the model, and define transfer elements along those beams to the next closest lower support that intersects that beam instead of selecting the closest lower support. Another illustrative example is whether or not to delete the already defined transfer elements when selecting the Generate Tributaries 806 button.

In an embodiment, the panel 810 further comprises a sub-panel 804 that is configured to list transferred vertical supports and to enable adding and clearing supports from the list. For example, the sub-panel 804 may comprise checkbox widgets 803 with which a user may specify listing columns, walls, both or neither in a table 814 of supports. In an embodiment, selecting one or both of the checkbox widgets 803 causes the tributary load manager logic to update the table 814 with data for supports corresponding to the selections in the checkbox widgets. After such an update, each row in the table 814 represents a particular vertical support that is associated with one or more other vertical supports to which load is transferred. For each such support, the table 814 may include a reference plane column 816, support name column 818, offset column 820, and count column 822. In an embodiment, reference plane column 816 is configured to display a plane number of a plane in which the transferred support is located. The support name column 818 may specify the support that has a transfer to other supports. The offset column 820 may specify a percentage of load that is transferred to other supports. The count column 822 may specify the number of other supports to which that percentage of load is transferred.

In an embodiment, an Add Support button 824 is provided and, when selected, causes opening a user interface dialog box that is configured to receive data for defining a new support. In an embodiment, a Clear Supports button 826 is provided and, when selected, causes clearing all supports that are listed for the actively selected row in the table 814 and re-displaying an empty cell 822. An OK button 828 may be configured to persistently store the values shown in the table 814 in the database 112 and close the panel 810.

Various embodiments of the computer system, data processing methods, and other techniques that are described herein provide numerous distinct benefits and advantages over previous practice including efficiency, accuracy of load calculation, data needed for live load reduction, and validation.

Benefits that lead to a more efficient process of calculating loads for vertical supports in a building structure include the following. Traditional methods of calculating column and wall loads have either relied on time-consuming and error-prone manual methods or general 3D Finite Element Method (FEM) software programs. The manual method requires the printing of each slab, drawing of tributary regions on the image, and calculation of tributary data such as areas and loads. This process has to be repeated for each level of a building. The tributary data is usually tabulated in a spreadsheet where the cumulative loads are calculated. Load transfers for discontinuous supports have to be identified and addressed individually in the spreadsheet. This process is highly labor intensive, error prone, and has to be re-done each time the building geometry changes, which is frequent during the early stages of the design process. In contrast, the approaches herein allow the rapid and automated calculation of tributary regions and data by only requiring 3D data of the physical layout of the building, data that is readily available in most modern engineering offices.

For the alternative traditional method of utilizing 3D FEM software for the calculation of vertical support loads to work, one must first have a working 3D Finite Element Method analytical model of the entire building structure. This is typically a time-consuming process and can require substantial time to configure the analytical model in such a way that is produces reliable results. A typical 3D FEM building model may have thousands of discrete analytical elements that all need to be properly connected and configured to produce a reliable results. Often, users spend hours or days trying to trouble shoot such complex analytical models before obtaining usable results. In contrast, the approaches herein may circumvent the requirement of having to define and configure a sophisticated 3D FEM analytical model of the building by simply reasoning about the physical properties of a building model.

The physical 3D properties of a proposed building are typically modeled and available before any analytical modeling. Many software are available in the market that support the efficient modeling of the physical properties of a building—CAD software like AutoCAD, Building Information Modeling software like Autodesk Revit or Tekla, or any of the general 3D structural analysis software. Embodiments described herein, however, can reason about the basic physical information present in these computer models to efficiently generate tributary boundaries and data.

The benefits of the approaches herein with respect to accurate vertical load calculation include providing an alternative and in some cases a safer load calculation approach for vertical columns and walls than the traditional 3D FEM methods. Traditional 3D FEM methods rely on the elastic distribution of loads in 3D analytic model of a building structure. These 3D analytical models of a building assume the structure is in its final configuration and transfer loads horizontally based on the relative elastic stiffness of the members in the model. It is well understood and accepted in the structural engineering community that the actual distribution of loads in vertical elements can be substantially different in the real structure that is constructed element and level-by-level. In some cases, the vertical loads calculated by traditional 3D FEM approaches underestimate the actual loads, potentially leading to unsafe structural designs of columns and walls. In recognition of this potential risk, many engineering firms do not rely on the vertical loads calculated by 3D FEM software for their column designs. Instead, they carry out a manual load takedown. The vertical loads calculated by the computational approach presented in the embodiments herein calculate loads that correspond to the manual calculation approach.

Benefits that support the efficient calculation of data required to carry out live load reduction in tall buildings presented herein include the following. Most building codes allow for the reduction of certain types of loads when designing the vertical supports of multi-level structures. These codes typically link the allowable percentage of load reduction to the total cumulative floor area each vertical column or wall supports. Typical 3D FEM software do not calculate these values as part of their regular elastic load calculations and require engineers to calculate the floor areas each column carries manually, which is not efficient. The individual and cumulative tributary areas calculated by the computational algorithms of the techniques described herein automatically calculate these required floor areas. Tributary areas represent floor areas. It is envisioned that some engineers will only use the data from the Invention for this purpose and not load calculation.

Another area of value provided by the techniques herein is the ability to validate traditional 3D FEM results. 3D FEM analysis programs rely on a sophisticated analytical representation of building structures to simulate their response under applied loads and often run as closed "black boxes", just giving a final analysis result. Most engineers today don't have the education, knowledge or experience to validate the results they get from running these black box analyses against real world benchmark data. This can cause a dangerous situation where building are being designed based on analytical representations that are not correct and could possibly result in unsafe designs. It is envisioned that an embodiment would be within traditional 3D FEM software where an end-user could calibrate or validate their 3D FEM results against the loads calculated using this alternative methodology.

The approach presented herein are fast, reliable, and not prone to the same fine-tuning requirements of 3D FEM analysis approaches, making it a reliable benchmark set of data for a building design.

3. Hardware Overview

According to one embodiment, the techniques described herein are implemented by one or more special-purpose computing devices. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 9:
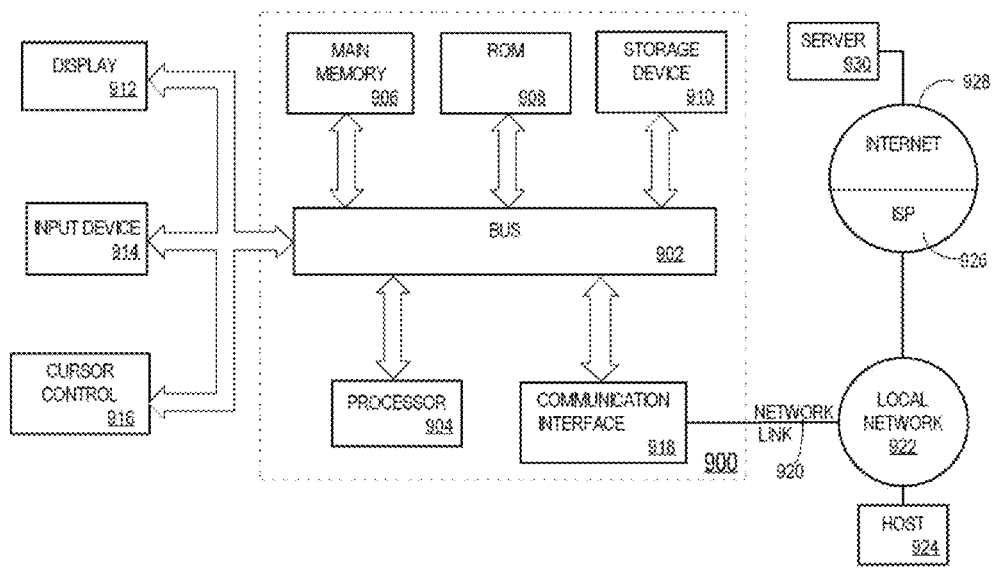
FIG. 9 illustrates a computer system with which an embodiment may be implemented.

For example, FIG. 9 is a block diagram that illustrates a computer system 900 upon which an embodiment of the invention may be implemented. Computer system 900 includes a bus 902 or other communication mechanism for communicating information, and a hardware processor 904 coupled with bus 902 for processing information. Hardware processor 904 may be, for example, a general purpose microprocessor.

Computer system 900 also includes a main memory 906, such as a random access memory (RAM) or other dynamic storage device, coupled to bus 902 for storing information and instructions to be executed by processor 904. Main memory 906 also may be used for storing temporary variables or other intermediate information during execution of instructions to be executed by processor 904. Such instructions, when stored in non-transitory storage media accessible to processor 904, render computer system 900 into a special-purpose machine that is customized to perform the operations specified in the instructions.

Computer system 900 further includes a read only memory (ROM) 908 or other static storage device coupled to bus 902 for storing static information and instructions for processor 904. A storage device 910, such as a magnetic disk or optical disk, is provided and coupled to bus 902 for storing information and instructions.

Computer system 900 may be coupled via bus 902 to a display 912, such as a cathode ray tube (CRT), for displaying information to a computer user. An input device 914, including alphanumeric and other keys, is coupled to bus 902 for communicating information and command selections to processor 904. Another type of user input device is cursor control 916, such as a mouse, a trackball, or cursor direction keys for communicating direction information and command selections to processor 904 and for controlling cursor movement on display 912. This input device typically has two degrees of freedom in two axes, a first axis (e.g., x) and a second axis (e.g., y), that allows the device to specify positions in a plane.

Computer system 900 may implement the techniques described herein using customized hard-wired logic, one or more ASICs or FPGAs, firmware and/or program logic which in combination with the computer system causes or programs computer system 900 to be a special-purpose machine. According to one embodiment, the techniques herein are performed by computer system 900 in response to processor 904 executing one or more sequences of one or more instructions contained in main memory 906. Such instructions may be read into main memory 906 from another storage medium, such as storage device 910. Execution of the sequences of instructions contained in main memory 906 causes processor 904 to perform the process steps described herein. In alternative embodiments, hard-wired circuitry may be used in place of or in combination with software instructions.

The term "storage media" as used herein refers to any non-transitory media that store data and/or instructions that cause a machine to operation in a specific fashion. Such storage media may comprise non-volatile media and/or volatile media. Non-volatile media includes, for example, optical or magnetic disks, such as storage device 910. Volatile media includes dynamic memory, such as main memory 906. Common forms of storage media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge.

Storage media is distinct from but may be used in conjunction with transmission media. Transmission media participates in transferring information between storage media. For example, transmission media includes coaxial cables, copper wire and fiber optics, including the wires that comprise bus 902. Transmission media can also take the form of acoustic or light waves, such as those generated during radio-wave and infra-red data communications.

Various forms of media may be involved in carrying one or more sequences of one or more instructions to processor 904 for execution. For example, the instructions may initially be carried on a magnetic disk or solid state drive of a remote computer. The remote computer can load the instructions into its dynamic memory and send the instructions over a telephone line using a modem. A modem local to computer system 900 can receive the data on the telephone line and use an infra-red transmitter to convert the data to an infra-red signal. An infra-red detector can receive the data carried in the infra-red signal and appropriate circuitry can place the data on bus 902. Bus 902 carries the data to main memory 906, from which processor 904 retrieves and executes the instructions. The instructions received by main memory 906 may optionally be stored on storage device 910 either before or after execution by processor 904.

Computer system 900 also includes a communication interface 918 coupled to bus 902. Communication interface 918 provides a two-way data communication coupling to a network link 920 that is connected to a local network 922. For example, communication interface 918 may be an integrated services digital network (ISDN) card, cable modem, satellite modem, or a modem to provide a data communication connection to a corresponding type of telephone line. As another example, communication interface 918 may be a local area network (LAN) card to provide a data communication connection to a compatible LAN. Wireless links may also be implemented. In any such implementation, communication interface 918 sends and receives electrical, electromagnetic or optical signals that carry digital data streams representing various types of information.

Network link 920 typically provides data communication through one or more networks to other data devices. For example, network link 920 may provide a connection through local network 922 to a host computer 924 or to data equipment operated by an Internet Service Provider (ISP) 926. ISP 926 in turn provides data communication services through the world wide packet data communication network now commonly referred to as the "Internet" 928. Local network 922 and Internet 928 both use electrical, electromagnetic or optical signals that carry digital data streams. The signals through the various networks and the signals on network link 920 and through communication interface 918, which carry the digital data to and from computer system 900, are example forms of transmission media.

Computer system 900 can send messages and receive data, including program code, through the network(s), network link 920 and communication interface 918. In the Internet example, a server 930 might transmit a requested code for an application program through Internet 928, ISP 926, local network 922 and communication interface 918.

The received code may be executed by processor 904 as it is received, and/or stored in storage device 910, or other non-volatile storage for later execution.

In the foregoing specification, embodiments of the invention have been described with reference to numerous specific details that may vary from implementation to implementation. The specification and drawings are, accordingly, to be regarded in an illustrative rather than a restrictive sense. The sole and exclusive indicator of the scope of the invention, and what is intended by the applicants to be the scope of the invention, is the literal and equivalent scope of the set of claims that issue from this application, in the specific form in which such claims issue, including any subsequent correction.

What is claimed is:

1. A method of determining loads of vertical columns in multi-story irregular building structures based upon both horizontal load factors and vertical load factors in a three-dimensional (3D) model of the building structures on a computer display device, the method comprising:
    using a computer, obtaining slab definition data that defines a plurality of planar slabs or floors of a building structure, and location points of a plurality of vertical columns that are on, into or above the slabs or floors, without using definitions of horizontal beams or other load path input data that specifies an explicit load path among the columns, and displaying a 3D geometric representation of the slabs or floors and the columns;
    using the computer and the slab definition data, creating and storing slab tributary region data defining a plurality of tributary regions across each of the slabs or floors that are associated with the columns without using definitions of horizontal beams or other load path input data that specifies an explicit load path among the columns;
    determining, using the computer and the slab tributary region data, tributary data defining a tributary for each of the columns based only upon a geometry of the slabs or floors and the location points of the plurality of columns;
    determining, using the computer and the tributary data, independent of and without considering the slab definition data, one or more load transfer elements that indicate structural elements of the building structure that transfer load from a first particular column of a first one of the slabs or floors to a second particular column of a second one of the slabs or floors wherein the load transfer elements are selected based upon the slab tributary region data;
    using the computer, without consideration of elastic distribution of forces between slabs, columns and walls, determining and graphically displaying a plurality of proposed load takedown paths in the building structure through the columns and the one or more load transfer elements and corresponding column load values associated with the columns of the building structure;
    creating and causing displaying a list of the tributary regions and column load values.

2. The method of claim 1, wherein creating and storing slab tributary region data comprises, using the computer, discretizing the slab definition data to result in creating and storing discretized slab data defining a plurality of discrete regions across each of the slabs or floors that are associated with the columns.

3. The method of claim 2, wherein determining the tributary data comprises: using the computer, associating a plurality of regions of the slab or floor represented in the discretized slab data with a particular sub-area from among a plurality of sub-areas;
    storing, in association with each particular sub-area, a column identifier of a particular column among the plurality of columns that is closest to that particular sub-area.

4. The method of claim 3, further comprising, using the computer, receiving granularity input specifying a larger or smaller granularity level for the discrete regions, and reperforming the step of discretizing the slab definition data to result in creating and storing updated discretized slab data defining an updated plurality of discrete regions that are associated with the columns, based upon the specified granularity level.

5. The method of claim 2, further comprising receiving input data specifying a modification to one of the sub-areas.

6. The method of claim 1, wherein creating and storing slab tributary region data comprises, using the computer, performing Voronoi decomposition upon the slab definition data.

7. The method of claim 1, further comprising receiving input data specifying a modification of a horizontal load path and percentage of transfer.

8. The method of claim 1, wherein the slab definition data defines the slab or floor using any polygonal form of perimeter.

9. The method of claim 1, wherein the slab definition data includes beam definition data defining one or more beams in the slab or floor and without data that specifies an explicit load path among the columns.

10. The method of claim 1, wherein the steps of the method are performed as a part of a computer-implemented general three-dimensional (3D) structural analysis and design program for building concrete structures.

11. One or more non-transitory storage media storing instructions which, when executed by one or more computing devices, cause performance of a method of determining loads of vertical columns in multi-story irregular building structures based upon both horizontal load factors and vertical load factors in a three-dimensional (3D) model of the building structures on a computer display device, the method comprising:

using a computer, obtaining slab definition data that defines a plurality of planar slabs or floors of a building structure, and location points of a plurality of vertical columns that are on, into or above the slabs or floors, without using definitions of horizontal beams or other load path input data that specifies an explicit load path among the columns, and displaying a 3D geometric representation of the slabs or floors and the columns;

using the computer and the slab definition data, creating and storing slab tributary region data defining a plurality of tributary regions across each of the slabs or floors that are associated with the columns without using definitions of horizontal beams or other load path input data that specifies an explicit load path among the columns;

determining, using the computer and the slab tributary region data, tributary data defining a tributary for each of the columns based only upon a geometry of the slabs or floors and the location points of the plurality of columns;

determining, using the computer and the tributary data, independent of and without considering the slab definition data, one or more load transfer elements that indicate structural elements of the building structure that transfer load from a first particular column of a first one of the slabs or floors to a second particular column of a second one of the slabs or floors wherein the load transfer elements are selected based upon the slab tributary region data;

using the computer, without consideration of elastic distribution of forces between slabs, columns and walls, determining and graphically displaying a plurality of proposed load takedown paths in the building structure through the columns and the one or more load transfer elements and corresponding column load values associated with the columns of the building structure;

creating and causing displaying a list of the tributary regions and column load values.

12. A method of determining loads of columns in building structures based upon both horizontal load factors and vertical load factors in a three-dimensional (3D) model of the building structures on a computer display device, the method comprising:

using a computer, obtaining plane definition data that defines a plurality of planes of a building structure, and location points of a plurality of columns that are on, into or above the planes, without using load path input data that specifies an explicit load path among the columns, and displaying a 3D geometric representation of the planes and the columns;

using the computer and the plane definition data, creating and storing plane tributary region data defining a plurality of tributary regions across the plane that are associated with the columns without using definitions of horizontal beams or other load path input data that specifies an explicit load path among the columns;

determining, using the computer and the plane tributary region data, tributary data defining a tributary for each of the columns based only upon a geometry of the planes and the location points of the plurality of columns;

determining, using the computer and the tributary data, independent of and without considering the plane definition data, one or more load transfer elements that indicate structural elements of the building structure that transfer load from a first particular column of a first one of the planes to a second particular column of a second one of the planes wherein the load transfer elements are selected based upon the plane tributary region data;

using the computer, without consideration of elastic distribution of forces between planes, columns and walls, determining and graphically displaying a plurality of proposed load paths in the building structure through the columns and the one or more load transfer elements; determining a plurality of load values associated with the columns of the building structure; creating and causing displaying a list of the tributary regions and load values.

13. The method of claim 12, wherein creating and storing slab tributary region data comprises, using the computer, discretizing the plane definition data to result in creating and storing discretized slab data defining a plurality of discrete regions across each of the planes that are associated with the columns.

14. The method of claim 13, further comprising receiving input data specifying a modification to one of the sub-areas.

15. The method of claim 12, wherein creating and storing slab tributary region data comprises, using the computer, performing Voronoi decomposition upon the plane definition data.

16. The method of claim 12, wherein determining the tributary data comprises:

using the computer, associating a plurality of regions of the planes represented in the discretized plane data with a particular sub-area from among a plurality of sub-areas; storing; in association with each particular sub-area; a column identifier of a particular column among the plurality of columns that is closest to that particular sub-area.

17. The method of claim 16, further comprising, using the computer, receiving granularity input specifying a larger or smaller granularity level for the discrete regions, and reperforming the step of discretizing the plane definition data to result in creating and storing updated discretized plane data defining an updated plurality of discrete regions that are associated with the columns, based upon the specified granularity level.

18. The method of claim 12, further comprising receiving input data specifying a modification of the proposed load path.

19. The method of claim 12, wherein the plane definition data defines one of the planes using any polygonal form of perimeter.

20. The method of claim 12, wherein the plane definition data includes beam definition data defining one or more beams in one or more of the planes.

21. The method of claim 12, wherein the steps of the method are performed as a part of a computer-implemented structural analysis and design program for buildings either using general three-dimensional (3D) finite element method (FEM) or other computational approach.

22. The method of claim 12, further comprising obtaining location points of walls that are on the planes, creating and storing the plane tributary region data defining the tributary regions additionally in association with the columns and walls, determining the one or more load transfer elements in relation to the columns and walls, and determining the proposed load paths through the columns and walls.

23. The method of claim 12, further comprising: automatically determining, based upon the load transfer elements, proposed percentages of contribution of load for each of the columns; obtaining one or more input percentage values specifying one or more modifications to the proposed percentages of contribution; determining the proposed load paths based also upon the percentages of contribution.

24. The method of claim 12, further comprising determining and graphically displaying cumulative load values and sub-areas and tributaries for one or more columns or walls.

25. The method of claim 12, further comprising communicating one or more of the tributary region data, tributary data, and load values to one or more computing devices that are hosting or executing one or more structure design programs or structure analysis programs.

26. One or more non-transitory storage media storing instructions which, when executed by one or more computing devices, cause performance of a method of determining loads of columns in building structures based upon both horizontal load factors and vertical load factors in a three-dimensional (3D) model of the building structures on a computer display device, the method comprising:

using a computer, obtaining plane definition data that defines a plurality of planes of a building structure, and location points of a plurality of columns that are on, into or above the planes, without using load path input data that specifies an explicit load path among the columns, and displaying a 3D geometric representation of the planes and the columns;

using the computer and the plane definition data, creating and storing plane tributary region data defining a plurality of tributary regions across the plane that are associated with the columns without using definitions of horizontal beams or other load path input data that specifies an explicit load path among the columns;

determining, using the computer and the plane tributary region data, tributary data defining a tributary for each of the columns based only upon a geometry of the slabs or floors and the location points of the plurality of columns;

determining, using the computer and the tributary data, independent of and without considering the plane definition data, one or more load transfer elements that indicate structural elements of the building structure that transfer load from a first particular column of a first one of the planes to a second particular column of a second one of the planes wherein the load transfer elements are selected based upon the plane tributary region data;

using the computer, without consideration of elastic distribution of forces between planes, columns and walls, determining and graphically displaying a plurality of proposed load paths in the building structure through the columns and the one or more load transfer elements; determining a plurality of load values associated with the columns of the building structure; creating and causing displaying a list of the tributary regions and load values.

\* \* \* \* \*